United States Patent [19]
Cricchi

[11] 3,821,566
[45] June 28, 1974

[54] METHOD AND APPARATUS FOR ELECTRONICALLY RECOVERING METAL-NITRIDE-OXIDE SEMICONDUCTOR DEVICES EXPOSED TO RADIATION

[75] Inventor: James R. Cricchi, Catonsville, Md.

[73] Assignee: Westinghouse Electric Corporation, Pittsburgh, Pa.

[22] Filed: Mar. 10, 1972

[21] Appl. No.: 233,447

[52] U.S. Cl. .......... 307/304, 317/235 R, 317/235 G
[51] Int. Cl. .......................... H01l 19/00, H01l 11/14
[58] Field of Search .................. 317/235 G; 307/304

[56] References Cited

OTHER PUBLICATIONS

IBM Tech. Discl. Bul., "Complementary MNOS Electronically Alterable Read-Only Memory", by Krick, Vol. 13, No. 1, June 1970, pages 263–264.
IEEE Trans. On Nuclear Science, "Effect of Electron Radiation on Sitacon Nitride Insulated Gate Field Effect Transistors", by Newmar et al., Dec. 1967, pages 293–298.
RCA Engineer, "Radiation-Resistant COS/MOS Devices", by Murray et al., Jan 18, 1972, pages 40–45.

*Primary Examiner*—Jerry D. Craig
*Attorney, Agent, or Firm*—D. Schron

[57] ABSTRACT

A method and apparatus for recovering the original characteristics of complementary metal-nitride-oxide semi-conductor devices after irradiation by periodic application of driving and gate voltages above the normal driving and gate voltages to the two complementary devices connected in series.

6 Claims, 12 Drawing Figures

Fig. 5A
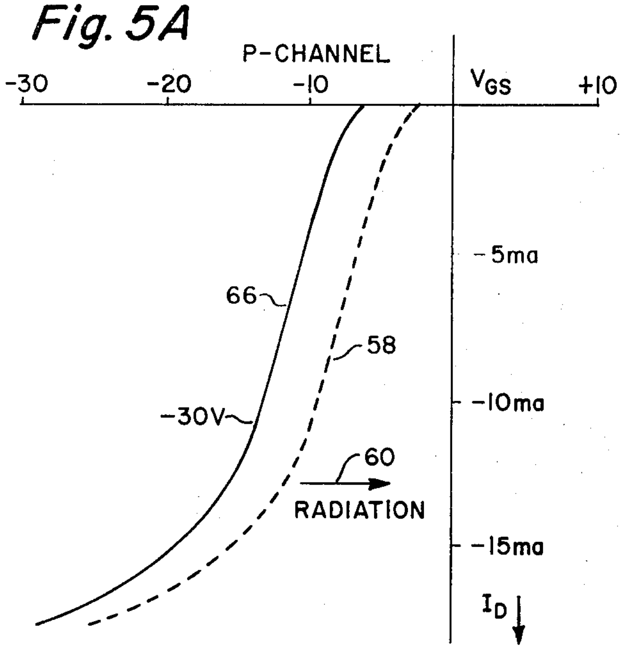
Fig. 5B
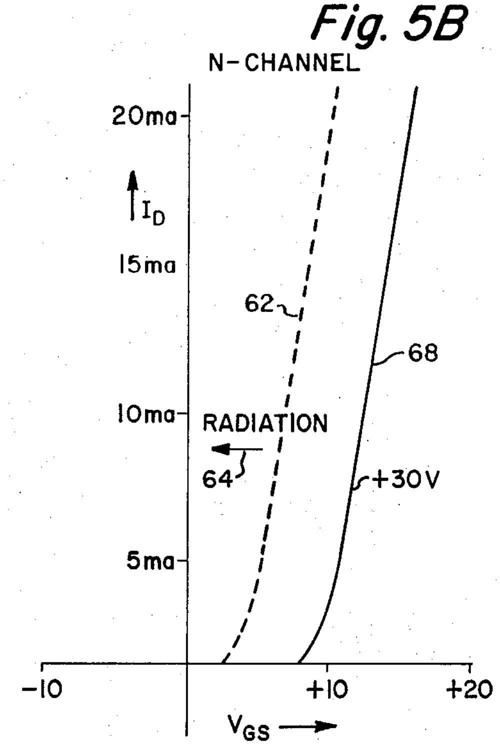
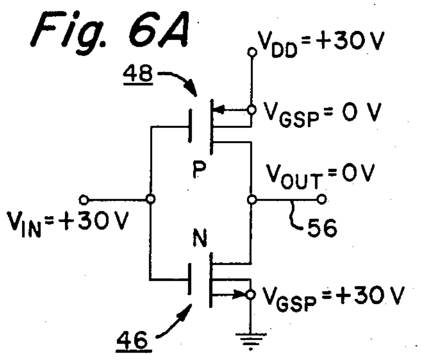
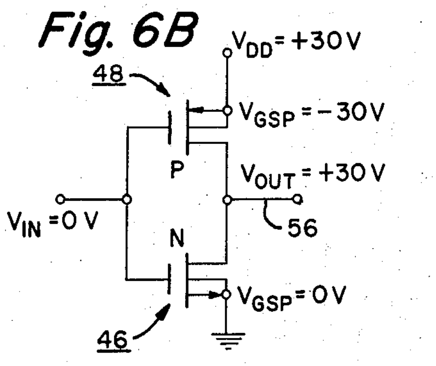
Fig. 6A, Fig. 6B
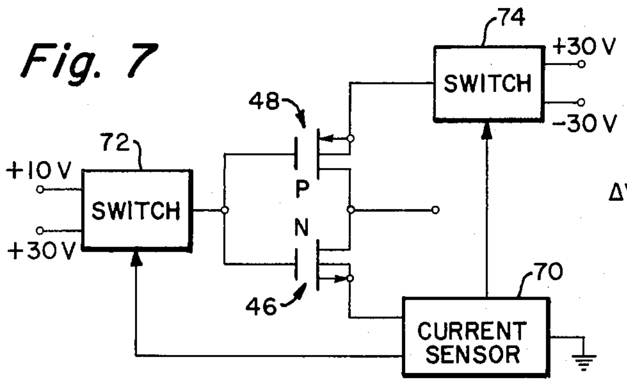
Fig. 7
Fig. 8
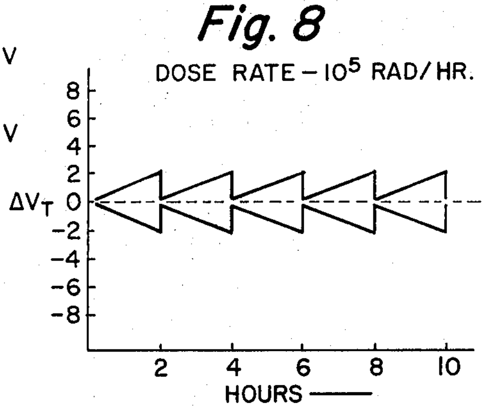

METHOD AND APPARATUS FOR ELECTRONICALLY RECOVERING METAL-NITRIDE-OXIDE SEMICONDUCTOR DEVICES EXPOSED TO RADIATION

BACKGROUND OF THE INVENTION

Complementary metal-nitride-oxide semiconductor devices (MNOS) have been constructed for use as memory devices and inverters wherein a P-channel and an N-channel MNOS device are connected in series. By connecting the complementary devices between the terminals of a source of driving potential and by applying a positive bias voltage (equal in magnitude to the driving voltage source) to the gate of each complementary device, the N-channel device will conduct or act as a closed switch such that the output voltage at the junction of the two devices will be that on one terminal of the driving voltage source. On the other hand, when the bias voltage is removed, the P-channel device will conduct or act as a closed switch whereby the output voltage between the devices will be equal to that of the other terminal of the driving voltage source.

As will be appreciated, radiation resistance in complementary MNOS devices is important for the reason that when subjected to radiation, charges build up at the nitride-oxide interface which tend to shift the threshold voltages of the devices. In avionics systems, radiation resistance to both transient flux and integrated dose have become very important factors. In the design of integrated circuits for these radiation hardened systems, many special techniques have been developed. For example, special topological designs are used to minimize transient photocurrents and new insulator materials such as aluminum oxide and oxynitride are employed to minimize the charge build-up generated by the integrated flux. Radiation hardening that has been accomplished using these techniques thus far has been done at the expense of either increased power dissipation in the circuits, increased fabrication complexity, increased cost, or in some cases poorer device characteristics.

SUMMARY OF THE INVENTION

In accordance with the present invention, a system is provided for electronically recovering the original characteristics of complementary MNOS devices after irradiation by applying across the complementary devices a source of driving potential and a bias potential which are larger than the normal sources of driving and bias potential. In this manner, and since irradiation in both the N-channel and P-channel devices causes the transfer characteristic of the device to shift toward the depletion mode during irradiation, the application of a large source of driving voltage periodically forces the transfer characteristic back toward the enhancement mode, thereby compensating for a shift in threshold voltage.

The above and other objects and features of the invention will become apparent from the following detailed description taken in connection with the accompanying drawings which form a part of this specification, and in which:

FIGS. 5A and 5B are plots of gate-substrate voltage versus drain-source current showing the transfer characteristics and the effect of irradiation thereon for P-channel and N-channel MNOS devices, respectively;

FIGS. 6A and 6B are equivalent circuit diagrams, similar to those of FIGS. 2A and 2B, showing the manner in which the gate and driving voltages are increased to electronically restore the complementary MNOS devices after irradiation;

FIG. 7 is a schematic circuit diagram of a system for automatically restoring the complementary MNOS devices after irradiation; and FIG. 8 is a plot of change in threshold voltage versus time showing the manner in which the characteristics of complementary MNOS devices are periodically restored after irradiation.

Figure 1:
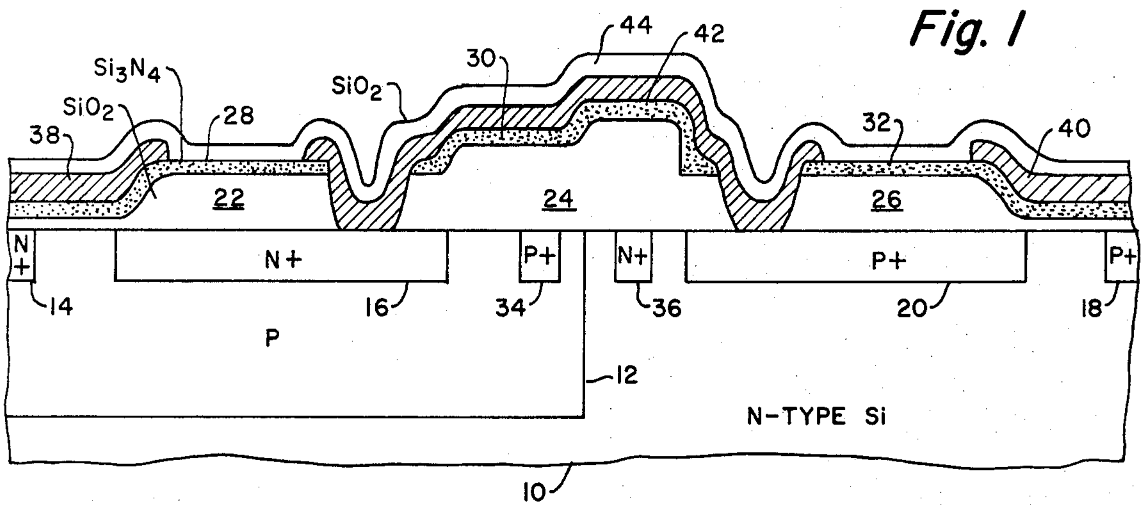
FIG. 1 is a cross-sectional view of complementary MNOS devices formed on a single silicon substrate.

With reference now to the drawings, and particularly to FIG. 1, there is shown in cross section an integrated circuit configuration having complementary MNOS field effect devices formed therein. It comprises an N-type silicon substrate 10 having a P-region 12 diffused therein. Diffused into the P-type region are a pair of N+ regions forming the source 14 and drain 16 of an N-channel MNOS device. Diffused into the N-type silicon substrate 10, at a point removed from the diffusion 12, are P+ regions forming the drain 18 and source 20 of an N-channel MNOS device. Deposited over the top of the substrate are layers 22, 24 and 26 of silicon dioxide; and above the layers of silicon dioxide are layers 28, 30 and 32 of silicon nitride. Guard or ring diffusions 34 and 36 are formed around each of the complementary MNOS devices. A metalization 38 spanning the distance between the N+ regions 14 and 16 forms the gate electrode of the P-channel MNOS device; while a second metalization 40 overlying the space between the P+ regions 18 and 20 forms the gate electrode of the P-channel MNOS device. The drain regions 16 and 18 of the respective MNOS devices are interconnected by means of metalization 42, the entire structure being covered by a layer 44 of silicon dioxide.

Figure 2A:
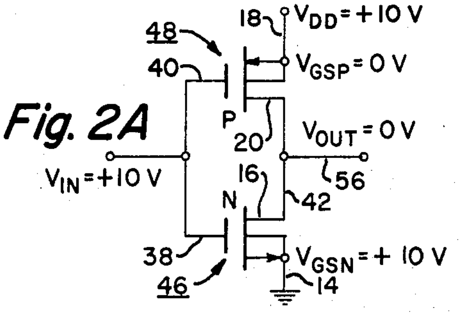
FIGS. 2A and 2B are equivalent circuit diagrams of the device of FIG. 1 for the case where a positive bias of normal magnitude is applied to both gate electrodes and where no bias is applied, respectively.
Figure 2B:
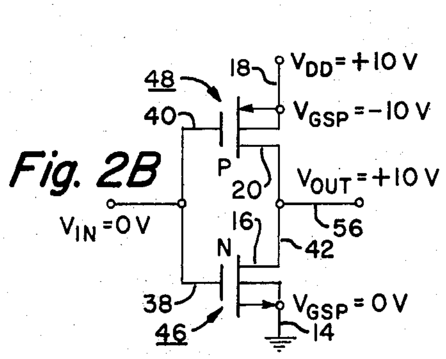

Equivalent circuits for the device of FIG. 1 are shown in FIGS. 2A and 2B where the N-channel MNOS device is identified by the reference numeral 46 while the P-channel MNOS device is identified by the reference numeral 48. Note that the gate electrodes 40 and 38 are interconnected; while an output is derived from the interconnected drains via metalization 42. Connected to the drain 18 of the P-channel device 48 is a source of driving potential $V_{DD}$; while the source 14 of the N-channel device is grounded (i.e., connected to the negative terminal of the source of driving potential).

Figure 3A:
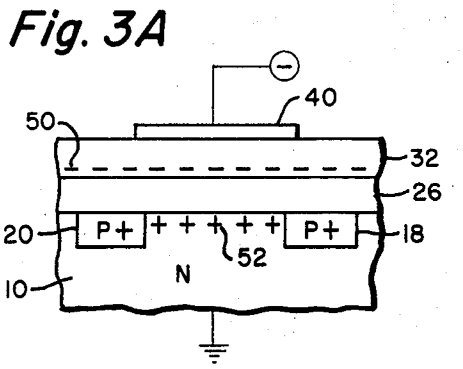
FIGS. 3A and 3B are simplified diagrams of N-channel and P-channel MNOS devices showing the manner in which they operate.
Figure 3B:
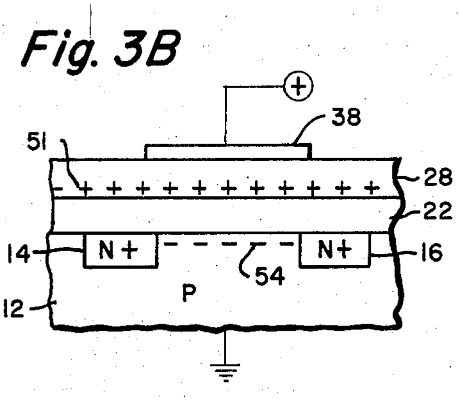

The operation of N-channel and P-channel devices is shown in FIGS. 3A and 3B. In effect, an MNOS device is a type of insulated-gate field effect transistor structure in which the usual silicon dioxide gate insulator is replaced by a double insulator, typically a layer of silicon dioxide nearest the silicon substrate and a layer of silicon nitride over the silicon dioxide. Traps or electronic states exist at or near the silicon dioxide-silicon nitride interface; and the threshold voltage of the device is influenced by the charged state of the traps. Thus, there exists as shown in FIGS. 3A and 3B negative charges 50 at the silicon dioxide-silicon nitride interface. In order to form a P-channel between the P+ regions 20 and 18 in the device of FIG. 3A, it is necessary to bias the gate 40 negative with respect to the substrate 10. In the N-channel device shown in FIG. 3B, it is necessary to bias the gate 38 positive with respect to the P-type substrate 12 in order to form an N-channel 54 between the N+ regions 14 and 16. When the devices of FIGS. 3A and 3B are exposed to radiation, negative traps 50 tend to accumulate at the silicon dioxide-silicon nitride interface in FIG. 3A; while positive traps 51 tend to accumulate in FIG. 3B. As will be explained hereinafter, this tends to make the threshold voltage for the P-channel device of FIG. 3A less negative and also tends to make the positive threshold in the device of FIG. 3B less positive. Thus, irradiation causes the threshold voltage of the N-channel device to move in the negative direction and the threshold voltage of the P-channel device to move in the positive direction. Both of the devices operate in the enhancement mode, meaning that they are normally OFF and can be turned ON only by application of a suitable bias potential between the gate and substrate.

Returning again to FIGS. 2A and 2B, the driving voltage $V_{DD}$ for the series-connected complementary MNOS devices is indicated as being +10 volts. When a gate voltage of +10 volts is applied to the gates of both complementary MNOS devices, the voltage, $V_{GSP}$, between the gate and substrate of the P-channel device 48 will be zero; while the gate-substrate voltage, $V_{GSN}$, of the N-channel device 46 will be +10 volts. Thus, an N-channel will be established in the device 46, effectively connecting the output terminal 56 to ground, with the result that the output voltage is 0 volts.

On the other hand, when the input voltage is zero volts as shown in FIG. 2B, the gate-substrate voltage on the P-channel device 48 will be −10 volts while the gate-substrate voltage applied to the N-channel device 46 will be 0 volts. As a result, a P-channel will form in device 48, effectively connecting the output terminal 56 to voltage $V_{DD}$, or +10 volts.

From an examination of the circuits of FIGS. 2A and 2B, it can be seen that the series-connected complementary MNOS devices act as an inverter which can be used in memory devices. That is, once a P-channel or N-channel is formed, it will persist until the gate-substrate voltage is varied.

Figure 4:
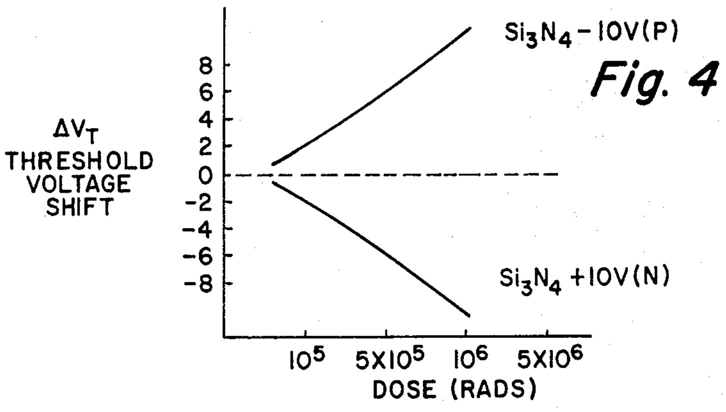
FIG. 4 is a plot of change in threshold voltage versus irradiation showing the manner in which the threshold voltage varies for the P-channel and N-channel complementary devices.

As was explained above, when complementary MNOS devices are exposed to radiation, the effect is to increase the trapped charges at the silicon dioxide-silicon nitride interface which, in turn, shifts the threshold voltage necessary to initiate a P-channel or N-channel and conduction through the respective MNOS devices. This is shown, for example, in FIGS. 4, 5A and 5B. In FIG. 4, it can be seen that as the radiation dosage increases, the threshold voltage of the P-channel device is shifted in the positive direction; whereas the threshold voltage of the N-channel device is shifted in the negative direction, almost in the same amounts. In FIG. 5A, the normal transfer curve of the P-channel device is indicated by the reference numeral 58. Exposure of the P-channel device to radiation causes the transfer curve 58 to move to the right or more positively along the direction of arrow 60. In FIG. 5B, the normal transfer curve of the N-channel device is identified by the reference numeral 62. Exposure to radiation causes the transfer curve to move to the left or in a negative direction as indicated by the arrow 64. If irradiation persists long enough without being corrected, the transfer curve will shift to the point where the device no longer operates in the enhancement mode but rather operates in the depletion mode. That is, if the transfer curve 58, for example, moves to the point where its intersection with the abscissa is at a plus voltage, the device will normally conduct and can be turned OFF only by applying a positive bias voltage. The same is true of the N-channel device. That is, if irradiation persists long enough, the transfer curve 62 will shift to the point where the device conducts at zero bias voltage and can be turned OFF only by application of a negative bias potential.

However, it is also a characteristic of MNOS devices that upon application of a sufficiently large gate-substrate bias voltage, the transfer curve can be made to shift in a direction opposite to the shift caused by irradiation because of the transport of charge through the oxide layer of the device. Thus, in the case of a P-channel MNOS device (FIG. 5A), the normal transfer curve 58 can be caused to shift to the left, to the position of transfer curve 66, in response to the application of a gate-substrate bias potential of −30 volts. Similarly, and with reference to FIG. 5B, the normal transfer curve 62 can be caused to move to the right to the position of curve 68 upon application of a gate-substrate bias potential of +30 volts. Thus, the application of a large (e.g., 30 volt) gate-substrate bias potential can cause the transfer curve to shift in a direction opposite to the shift caused by irradiation. This effect is utilized in accordance with the invention in electronically recovering complementary MNOS devices after being subject to irradiation.

Thus, as shown in FIG. 6A, when the driving voltage $V_{DD}$ is increased to +30 volts and the gate voltage applied to the gate electrode is increased to +30 volts, the gate-substrate voltage across the P-channel device 48 is zero; while that across the N-channel device is +30 volts. Under these circumstances, therefore, the transfer curve is caused to shift to the right as shown in FIG. 5B, correcting for irradiation. Similarly, in FIG. 6B, when the driving voltage remains at +30 volts and the gate voltage is zero, the gate-substrate voltage across the N-channel device 46 is 0 and that across the P-channel device 48 is −30 volts, causing the transfer curve to shift to the left as shown in FIG. 5A.

Apparatus for automatically effecting correction for devices subject to irradiation is shown in FIG. 7. The current through the N-channel MNOS device 46, for example, is sensed by current sensor 70; however a current sensor could also be used with MNOS device 48. It is assumed that irradiation will have the same effect on both MNOS devices and that, therefore, only the current through one need be sensed. Referring again to FIG. 5B, when the N-channel MNOS device 46 is subjected to radiation, the current therethrough will increase for a given bias voltage of +10 volts since the transfer curve 62 shifts to the left. When this increase in current is sensed by the current sensor 70, it actuates switches 72 and 74 to disconnect the 10-volt gate and driving voltage source connections and connect in their place a voltage of +30 volts. This, then, has the effect of shifting the N-channel transfer curve to the right as viewed in FIG. 5B and the P-channel transfer curve to the left as viewed in FIG. 5A, compensating for the change in threshold voltage caused by irradiation. The switches 72 and 74 need be closed to connect the +30 voltage sources to the gate and across the series-connected P-channel and N-channel devices long enough to effect the correction with the gate voltage shifting from +30 volts to 0.

Graphically, the result is shown in FIG. 8. Thus, after being exposed to $10^5$ rads per hour for 2 hours, the threshold voltage has shifted to the point where the current sensor 70 causes switches 72 and 74 to apply 30 volts, whereupon the threshold voltage shift again decreases to 0. During the next 2-hour period, again at a dose rate of $10^5$ rads per hour, the threshold voltage shift again increases to the point where 30 volts is again applied to bring the transfer curves of FIGS. 5A and 5B back to their original positions. This procedure is repeated periodically as determined, of course, by the dosage of the radiation to which the MNOS devices are exposed.

Although the invention has been shown and described in connection with certain specific embodiments, it will be readily apparent to those skilled in the art that various changes in form and arrangement of parts may be made to suit requirements without departing from the spirit and scope of the invention.

I claim as my invention:

1. A method for compensating for threshold voltage shifts caused by irradiation in complementary metal-nitride-oxide semiconductor devices having gate electrodes and having channels connected in series across a source of driving voltage, which comprises periodically varying the magnitude of both the driving voltage source as well as a voltage applied to both of said gate electrodes to thereby transport charge through the oxide layers of the devices to compensate for the generation of trapped charges at the oxide-nitride interfaces of said devices tending to shift the threshold voltages thereof.

2. The method of claim 1 wherein said source of driving voltage normally is at a level of 10 volts and the bias voltage applied to the gates of said devices is at 10 volts, said driving and bias voltage sources being periodically increased to 30 volts.

3. The method of claim 1 wherein said driving voltage is initially increased, followed by applying a voltage of like magnitude to the gate electrodes of said complementary devices, and then reducing the voltage applied to said gate electrodes to 0.

4. In combination, complementary P-channel and N-channel metal-nitride-oxide semiconductor devices connected in series across a source of driving potential with their drain contacts interconnected, means for applying a bias voltage to the gate electrodes of both of said devices such that one device will conduct when the bias voltage is present and the other will conduct when the bias voltage is absent, and means for periodically increasing said bias voltage and said driving potential to compensate for irradiation of said devices.

5. The combination of claim 4 wherein said driving potential and bias voltage are normally equal and are increased in equal amounts to compensate for irradiation.

6. The combination of claim 4 including means for sensing an increase in current through at least one of said devices, and means responsive to an increase in current sensed by said sensing means for increasing said bias voltage and said driving potential.

* * * * *